US009343680B2

(12) United States Patent
Sirringhaus et al.

(10) Patent No.: US 9,343,680 B2
(45) Date of Patent: May 17, 2016

(54) PRINTED ELECTRONIC DEVICE

(75) Inventors: Henning Sirringhaus, Cambridge (GB); Mario Carioni, Milan (IT); Enrico Gili, Cambridge (GB)

(73) Assignee: Cambridge Enterprise Limited, Cambridge (GB)

( * ) Notice: Subject to any disclaimer, the term of this patent is extended or adjusted under 35 U.S.C. 154(b) by 487 days.

(21) Appl. No.: 13/388,665

(22) PCT Filed: Jul. 29, 2010

(86) PCT No.: PCT/GB2010/051244
§ 371 (c)(1),
(2), (4) Date: Jul. 17, 2012

(87) PCT Pub. No.: WO2011/015847
PCT Pub. Date: Feb. 10, 2011

(65) Prior Publication Data
US 2012/0273788 A1     Nov. 1, 2012

(30) Foreign Application Priority Data

Aug. 3, 2009   (GB) .................................. 0913456.0

(51) Int. Cl.
*H01L 29/786*     (2006.01)
*H01L 51/00*      (2006.01)
(Continued)

(52) U.S. Cl.
CPC ............. *H01L 51/0022* (2013.01); *B82Y 10/00* (2013.01); *H01L 51/102* (2013.01)

(58) Field of Classification Search
CPC ............ H01L 21/288; H01L 21/76838; H01L 27/3276; H01L 21/02672; H01L 27/3248
USPC .................. 257/775, 40, 59, 72; 438/151, 637
See application file for complete search history.

(56) References Cited

U.S. PATENT DOCUMENTS

| 4,074,009 | A | 2/1978 | Sanders |
| 5,312,716 | A | 5/1994 | Unoki et al. |

(Continued)

FOREIGN PATENT DOCUMENTS

| EP | 1459397 | 9/2004 |
| EP | 1510861 | 3/2005 |

(Continued)

OTHER PUBLICATIONS

International Search Report and Written Opinion for PCT/GB2010/051244 dated Nov. 8, 2010.
(Continued)

*Primary Examiner* — Kenneth Parker
*Assistant Examiner* — Bo Fan
(74) *Attorney, Agent, or Firm* — Hamilton, DeSanctis & Cha LLP

(57) ABSTRACT

This invention generally relates to a patterned substrate for an electronic device and to electronic devices, device arrays, field effect transistors and transistor arrays comprising the patterned substrate. The invention also relates to a logic circuit, display, memory or sensor device comprising the patterned substrate. Further the invention relates to a method of patterning a substrate for an electronic device. In an embodiment, a patterned substrate for an electronic device comprises: a first body having an edge; a second body comprising an elongate plurality of printed droplets having an edge adjacent to and substantially aligned to said first body edge; and a separation between said first body edge and said second body edge, wherein said elongate plurality of printed droplets is at an angle of about 5 degrees to about 90 degrees to said first body edge.

16 Claims, 13 Drawing Sheets

(51) Int. Cl.
*B82Y 10/00* (2011.01)
*H01L 51/10* (2006.01)

(56) References Cited

U.S. PATENT DOCUMENTS

| | | | |
|---|---|---|---|
| 6,429,457 | B1 | 8/2002 | Berggren et al. |
| 6,500,604 | B1 | 12/2002 | Dimitrakopoulos et al. |
| 6,966,997 | B1 | 11/2005 | Inganas et al. |
| 2004/0079950 | A1 | 4/2004 | Takayama et al. |
| 2004/0173795 | A1* | 9/2004 | Moon ............... H01L 29/41733 257/59 |
| 2005/0032453 | A1 | 2/2005 | Tachikawa et al. |
| 2005/0036090 | A1 | 2/2005 | Hayashi et al. |
| 2005/0048414 | A1 | 3/2005 | Harnack et al. |
| 2006/0008746 | A1 | 1/2006 | Onishi et al. |
| 2006/0170111 | A1* | 8/2006 | Isa ....................... H01L 21/288 257/775 |
| 2006/0220126 | A1 | 10/2006 | Hulsman et al. |
| 2007/0018151 | A1* | 1/2007 | Sirringhaus ............ B82Y 10/00 257/40 |
| 2007/0205409 | A1 | 9/2007 | Lecloux et al. |
| 2008/0268582 | A1 | 10/2008 | Arai et al. |
| 2009/0136877 | A1 | 5/2009 | Suganuma et al. |
| 2009/0159886 | A1 | 6/2009 | Street |
| 2010/0289019 | A1 | 11/2010 | Katz et al. |

FOREIGN PATENT DOCUMENTS

| | | |
|---|---|---|
| EP | 1610339 | 12/2005 |
| EP | 1898478 | 3/2008 |
| EP | 1745521 | 7/2014 |
| GB | 2447509 | 9/2008 |
| JP | 2004006231 | 1/2004 |
| JP | 2008 108874 | 5/2008 |
| RU | 1788532 | 1/1993 |
| WO | 03/056641 | 7/2003 |
| WO | 2004079833 | 9/2004 |
| WO | 2006/076606 | 1/2006 |
| WO | 2009126916 | 10/2009 |

OTHER PUBLICATIONS

DeFranco et al., "Photolithographic Patterning of Organic Electronic Materials." Organic Electronics, (2006) 22-28. vol. 7. No. 1.

Sele et al., "Lithography-Free, Self-Aligned Inkjet printing with Sub-Hundred-Nanometer resolution." Advance Materials. 17 (8), pp. 997-1001 (2005).

Kawase et al., "Ink-jet printing of polymer thin film transistors." Thin Solid Films, 438-439, pp. 279-287 (2003).

Search Report for GB Application GB0913456.0 dated Jan. 27, 2010 (5 pgs).

Translation of Official Action for RU Application No. 2012108116 (5 pgs).

EPO Examination Search Report for Application No. EP 10 739 684.8-1555 dated Jan. 15, 2016. 6 pgs.

Zhang, M. et al., "A MEMS nanoplotter with high-intensity parallel dip-pen nanolithography probe arrays." Institute of Physics Publishing. Nanotechnology 13 (2002) 212-217. Mar. 2002.

* cited by examiner $$\sin\alpha = \frac{s}{2r}$$

PRINTED ELECTRONIC DEVICE

FIELD OF THE INVENTION

This invention generally relates to a patterned substrate for an electronic device and to electronic devices, device arrays, field effect transistors and transistor arrays comprising the patterned substrate. The invention also relates to a logic circuit, display, memory or sensor device comprising the patterned substrate. Further the invention relates to a method of patterning a substrate for an electronic device.

BACKGROUND TO THE INVENTION

Manufacturing of device arrays with high density, for example transistor arrays, is currently of interest in the field of microelectronics. This is particularly the case with regard to logic circuits, displays, memory and sensor devices. More specifically, arrays of organic, plastic or polymer devices, e.g., polymer field effect transistors such as thin-film transistors (TFTs), are of interest in part due to a desire for low cost and low complexity of electronic circuit fabrication, and for fabrication of circuits having flexible substrates.

Direct printing techniques, e.g., droplet deposition by ink-jet printing, may be suitable for flexible and non-flexible circuits. However, in both cases, there remains a need for a technique that allows advantages such as improved yield, in particular in combination with, inter alia, short device feature lengths for high speed device operation and/or increased density of device arrays.

Some high resolution techniques have been developed as the range of nanoscale electronic materials has expanded. This has been driven by a growing need for scalable patterning techniques that allow probing the electronic properties of materials such as carbon nanotubes, graphene, nanowires, or organic semiconductors on a typical length scale of 100 nm. Techniques such as electron beam lithography or nanoimprinting may be used to define suitable electrode structures for these applications. However, while these techniques may be suitable in some circumstances for patterning on flat, rigid substrates such as silicon wafers, they are less well suited to, inter alia, non-planar, stretchable and/or flexible substrates and for achieving the above example advantages.

In view of the above, there is a continuing need in the field of microelectronic devices to provide high resolution printed substrates for devices and device arrays with, for example, improved patterning yield.

For use in understanding the present invention, the following disclosures are referred to:

Avouris, P.; Chen, Z.; Perebeinos, V. Nat. Nanotechnol. 2007, 2 (10), 605-615.
Kanungo, M.; Lu, H.; Malliaras, G. G.; Blanchet, G. B. Science 2009, 323 (5911), 234-237.
Xia, Y. N.; Yang, P. D.; Sun, Y. G.; Wu, Y. Y.; Mayers, B.; Gates, B.; Yin, Y. D.; Kim, F.; Yan, Y. Q. Adv. Mater. 2003, 15 (5), 353-389.
Li, X. L.; Wang, X. R.; Zhang, L.; Lee, S. W.; Dai, H. J. Science 2008, 319 (5867), 1229-1232.
Bolotin, K. I.; Sikes, K. J.; Jiang, Z.; Klima, M.; Fudenberg, G.; Hone, J.; Kim, P.; Stormer, H. L. Solid State Commun. 2008, 146 (9-10), 351-355.
Cui, Y.; Wei, Q. Q.; Park H. K.; Lieber, C. M. Science 2001, 293 (5533), 1289-1292.
Duan, X. F.; Huang, Y.; Cui, Y.; Wang, J. F.; Lieber C. M. Nature 2001, 409 (68160), 66-69.
Nitzan, A.; Ratner, M. A. Science 2003, 300 (5624), 1384-1389.
Forrest, S. R. Nature 2004, 428 (6986), 911-918.
Kern D. P.; Houzego, P. J.; Coane, P. J.; Chang, T. H. P. J. Vac. Sci. Technol., B 1983, 1(4), 1096-1100.
Guo, L. J. Adv. Mater. 2007, 19 (4), 495-513.
Sirringhaus, H.; Sele, C. W.; von Werne, T.; Ramsdale, C. Organic Electronics, Materials, Manufacturing and Applications; WILEY-VCH; 2006, 294-322.
Wang, J. Z.; Zheng, Z. H.; Li, H. W.; Huck, W. T. S.; Sirringhaus, H. Nat. Mater. 2004, 3 (3), 171-176.
Sele, C. W.; von Werne, T.; Friend, R. H.; Sirringhaus, H. Adv. Mater. 2005, 17 (8), 997-1001.
Creagh, L. T.; Mcdonald, M. MRS Bulletin 2003, 28 (11), 807-811.
Murata, K.; Matsumoto, J.; Tezuka, A.; Matsuba, Y.; Yokoyama, H. Microsyst. Tech. 2005, 12 (1), 2-7.
Park, J. U.; Hardy, M.; Kang, S. J.; Barton, K.; Adair, K.; Mukhopadhyay, D. K.; Lee, C. Y.; Strano, M. S; Alleyne, A. G.; Georgiadis, J. G.; Ferreira, P. M.; Rogers, J. A. Nat. Mater. 2007, 6 (10), 782-789.
Sekitani, T.; Noguchi, Y.; Zschieschang, U.; Klauk, H.; Someya, T. Proc. Nat. Acad. Sci. U.S.A. 2008, 105 (13), 4976-4980.
Zhao, N.; Chiesa, M.; Sirringhaus, H.; Li, Y.; Wu, Y.; Ong, B. J. Appl. Phys. 2007, 101 (6), 064513.
Noh, Y. Y.; Zhao, N.; Caironi, M.; Sirringhaus, H. Nat. Nanotechnol. 2007, 2 (12), 784-789.
Campbell, I. H.; Kress, J. D.; Martin, R. L.; Smith, D. L.; Barashkov, N. N.; Ferraris, J. P., Appl. Phys. Lett. 1997, 71 (24), 3528-3530.
Noh, Y. Y.; Sirringhaus, H Org. Electron. 2009, 10 (1), 174-180.
Richards, T. J.; Sirringhaus, H. J. Appl. Phys. 2007, 102 (9), 094510.
Bürgi, L.; Richards, T. J.; Friend, R. H.; Sirringhaus, H. J. Appl. Phys. 2003, 94 (9), 6129-6137.
International patent application WO03/056641, Plastic Logic Limited, Cambridge University Technical Services Limited, Jul. 10, 2003, related U.S. Pat. No. 7,407,849, Sirringhaus et al., Self-Aligned Printing, Aug. 5, 2008 and related European patent publication EP1459397, Plastic Logic Limited, Cambridge University Technical Services Limited, Sep. 22, 2004, similarly JP2005513818 and CN1618136;
US patent application US2009/159886 A1, Street;
GB patent application GB2447509 A, Seiko;
European patent application EP1898478 A1, Ricoh;
European patent application EP1745521 A1, Plastic Logic;
International patent application WO2006/076606 A2, Cabot Corp;
Paper "Inkjet printing of polymer thin film transistors", Kawase et al, Thin Solid Films, 438-439, pp. 279-287 (2003).

SUMMARY OF THE INVENTION

According to a first aspect of the present invention, there is provided a patterned substrate for an electronic device, comprising: a first body having an edge; a second body comprising an elongate plurality of printed droplets having an edge adjacent to and substantially aligned to said first body edge; and a separation between said first body edge and said second body edge, wherein said elongate plurality of printed droplets is at an angle of about 5 degrees to about 90 degrees to said first body edge.

Preferably, the elongate plurality of printed droplets is substantially perpendicular to said first body edge. Further preferably, a width of the elongate plurality of printed droplets is substantially equal to the width, e.g., diameter, of a printed single said droplet. (References to a width of a droplet throughout this specification may refer to the diameter of a substantially spherical droplet).

An embodiment comprises said first body and comprises said elongate plurality of printed droplets in a T-shape. An advantage of such an embodiment is the provision of a self-aligned, single-droplet electrode gap from T-shaped printed electrodes.

There may further be provided the patterned substrate, wherein at least one of said first body and said second body comprises an electrode.

There may further be provided the patterned substrate, wherein said separation contains at least semiconductor.

There may further be provided the patterned substrate, wherein said separation contains at least dielectric.

There may further be provided the patterned substrate, wherein a width of said second body edge is less than about 200 μm.

There may further be provided the patterned substrate, wherein a width of said elongate plurality of printed droplets is equal to or less than about 250 μm, and preferably equal to or less than about 80 μm.

There may further be provided the patterned substrate, wherein a width of said elongate plurality of printed droplets is substantially equal to the diameter of a printed single said droplet.

There may further be provided the patterned substrate, wherein said separation has a length equal to or less than about 2 μm.

There may further be provided the patterned substrate, wherein a ratio of a width of said elongate plurality of printed droplets to a length of said separation is greater than or equal to about 100.

There may further be provided the patterned substrate, wherein said second body comprises an edge portion adjoining said second body edge, said edge portion having a curvature B and said second body edge having length S, wherein B is less than about 2/S.

There may further be provided the patterned substrate, wherein said second body comprises an edge portion having curvature B adjoining said second body edge and a tangent to said edge portion makes an angle of about a with second body edge, wherein said angle α and curvature B satisfy:

$$\alpha = \text{Arc } \sin\left(\frac{S}{2} \cdot B\right) \pm 20°$$

There may further be provided the patterned substrate, wherein said first body and said elongate plurality of printed droplets are arranged in a T-shape or an L-shape, preferably a T-shape.

An embodiment provides an electronic device comprising the patterned substrate.

An embodiment provides the above electronic device, wherein said electronic device is a field effect transistor.

An embodiment provides a device array comprising a plurality of the electronic devices.

According to a further aspect of the present invention, there is provided a field effect transistor comprising a source electrode, a drain electrode, a gate electrode, a semiconductor region electrically between the source electrode and the drain electrode and a dielectric region electrically between the semiconductor region and the gate electrode, wherein: a first said electrode has an edge; and another of said electrodes comprises an elongate plurality of printed droplets having an edge adjacent to and substantially aligned to said first electrode, wherein said elongate plurality of droplets is at an angle of about 5 degrees to about 90 degrees to said edge of said first electrode.

Similarly to the first aspect, in the field effect transistor of the further aspect, the elongate plurality of droplets may be substantially perpendicular to said edge of said first electrode, and/or a width of the elongate plurality of printed droplets may be substantially equal to the width, e.g., diameter, of a printed single said droplet. Preferably there is also a separation between said electrodes.

An embodiment provides a transistor array comprising a plurality of the above field effect transistors.

According to a still further aspect of the present invention, there is provided a method of patterning a substrate for an electronic device, comprising: depositing an elongate plurality of droplets of a liquid adjacent to an edge of a first body on a substrate to form at least a portion of a second body, wherein the first body, the liquid and the substrate are such that the liquid is repelled from the first body to form an edge of said second body substantially aligned to said first body edge; and said elongate plurality of droplets is at an angle of about 5 degrees to about 90 degrees to said first body edge. The deposition of the elongate plurality of droplets may be by printing.

Again similarly, the elongate plurality of droplets may be substantially perpendicular to said first body edge, and/or the deposition of said elongate plurality of droplets may comprise depositing said droplets such that a width of said elongate plurality of droplets is substantially equal to a width, e.g., diameter, of a printed single said droplet. Preferably there is also a separation between said electrodes.

There may further comprise the method, wherein said depositing deposits said elongate plurality of droplets partially on said first body.

There may further comprise the method, wherein said depositing deposits said elongate plurality of droplets on a region of said substrate not in contact with said first body.

There may further comprise the method, wherein said liquid comprises a solvent, the method further comprising said solvent evaporating from said deposited elongate plurality of droplets.

There may further comprise the method, wherein the boiling point of said solvent is selected such that evaporation takes place at about 25 deg C. during a period of at least about 1 minute.

There may further comprise the method, further comprising depositing a plurality of droplets of a liquid to form said first body.

There may further comprise the method, further comprising depositing on said first body a layer for repulsion of said liquid of said elongate plurality of droplets, prior to said depositing said elongate plurality of droplets. The layer may be a self-assembled monolayer.

An embodiment provides an electronic device formed by the above method.

An embodiment provides a device array comprising a plurality of the above electronic devices.

According to another aspect of the present invention, there is provided a field effect transistor comprising a source electrode, a drain electrode, a gate electrode, a semiconductor region electrically between the source electrode and the drain electrode and a dielectric region electrically between the semiconductor region and the gate electrode, wherein said source electrode and said drain electrode are formed by the above method.

An embodiment provides a transistor array comprising a plurality of the above field effect transistors.

An embodiment provides a logic circuit, display, memory or sensor device comprising a patterned substrate as described above, an electronic device as described above, a device array as described above, a field effect transistor as described above, or a transistor array as described above.

Further aspects may be provided as methods corresponding to the above patterned substrate, device and array aspects and, conversely, patterned substrates, devices and device arrays corresponding to the above method aspects.

Preferred embodiments are defined in the appended dependent claims.

The substrates used in the methods of the invention may be any conventional substrate used in the preparation of electronic devices. Representative examples of substrates include plastics (e.g. polyethylene terephthalate or polyethylene naphthalene), metals, quartz, glass and $Si/SiO_2$. The substrate may also be coated. Preferred substrates are glass and $Si/SiO_2$.

Preferably, the elongate plurality of printed droplets may comprise two or more droplets. Preferably it is a substantially straight line (e.g. a straight line) of droplets. (In some embodiments, the line may be curved to an extent). The droplets may be printed successively. The droplets may be adjoining so that the elongate plurality of droplets is a continuous line of droplets, the line preferably being of single-droplet width.

In addition to the second body comprising deposited droplets, the first body may also be printed, for example in the same droplet deposition stage as the second body. Alternatively, the first body may be fabricated by any other technique, e.g., evaporation.

Either or both of the first and second bodies may be joined to or integral with further printed portions, such as any number of branches routed to other features such as terminals or devices located in various directions relative to the first body edge.

The elongate plurality of droplets and the first body edge may generally be defined as being non-parallel. More specifically, the angle referred to above may be exactly 5-90 degrees or, more preferably, about 45 degrees to about 90 degrees, and may be clockwise or anticlockwise, i.e., +/−, from the first body edge. Preferably the angle is in the range 10 to 90 degrees, more preferably 30 to 90 degrees, still more preferably 50 to 90 degrees.

Determination of the angle may be relatively straightforward where the elongate plurality of printed droplets is a substantially straight line. Where the elongate plurality of printed droplets follows a more curved line, a straight line that is a best-fit, e.g., a linear least squares fit, to the curved printed line, may define the above angle relative to the first body edge. Nevertheless, in either the substantially straight or more curved case, at least a straight line between the centres of the two (or preferably more, e.g., five or ten) adjoining droplets nearest the first body edge is preferably at the above angle of about 5 degrees to about 90 degrees.

Further in this regard, the elongate plurality of printed droplets is preferably substantially perpendicular (e.g. perpendicular) to the first body edge. (Again, this may apply to the best-fit or at least the above two/five/ten adjoining droplets as for the angle above). For example, the first body and the elongate plurality of printed droplets may be arranged in a T-shape or an L-shape, or even cross (+) shape if printing of the second body continues from one side of the first body to the other.

Generally, the first body edge may be at least a portion of a side of the first body that is longer than the second body edge and/or the width of the elongate plurality of printed droplets. Furthermore, the side comprising the first body edge may extend between two adjacent vertices of the first body perimeter. Thus, the first body edge may be a portion, i.e. an edge part not fully extending, between such vertices or a portion of a continuous curved edge defining the entire boundary of the first body. The above angle of about 5 degrees to about 90 degrees relative to the first body edge may be provided even where the first body edge is not fully or substantially straight, so that the angle is relative to a least squares fit of a more curved edge of the first body.

In preferred patterned substrates, e.g. where the substrate is provided in an electronic device, at least one of the first and second bodies may be or comprise an electrode, which may be designed to carry current/voltage signals. Thus, preferably the first and/or second body comprise metal, e.g., gold, silver or copper, particularly preferably gold or silver. The first and/or second body may comprise metal, for example as a dopant in a liquid ink and/or dispersed in the form of nanoparticles or of metal-complexes in a liquid ink. (Additionally or alternatively, the first and/or second body may comprise polymer). A suitable ink may be a metal-based ink with sintering temperature less than 150° C. This may be a complex based ink, e.g., silver complex ink TEC-IJ-010. The use of metallic electrodes, e.g., gold or silver, may reduce line resistivity and/or contact resistance in an embodiment.

The separation may comprise an air gap, and/or may contain material such as semiconductor or dielectric. Semiconductor may be applicable in the case that the separation forms a source-drain channel of a field effect transistor (FET). Dielectric may be more applicable where the separation forms gate insulation of a FET or a dielectric between electrodes/plates of a capacitive element.

A width of the second body edge may be less than about 200 μm, and preferably less than about 50 μm. This may be less than the width of the elongate plurality of printed droplets, e.g., less than the diameter of a single droplet where the elongate plurality of droplets is of single-droplet width. This can be seen by the second body edge having length S in FIG. 1(c). The width of the elongate plurality of printed droplets may be equal to or less than about 250 μm, and preferably equal to or less than about 80 μm with a correspondingly shorter second body edge length, e.g., about 70 μm or less. In this regard, the width of the elongate plurality of printed droplets may advantageously be substantially equal to the width of a single said droplet, e.g., about 30 to about 80 μm, preferably about 60 μm. In view of the above, the second body edge may advantageously be shorter than the channel width of, for example, a FET having parallel source and drain electrodes. (In this regard, it is noted that references to the width of an elongate plurality of droplets throughout this specification may refer to a maximum width of the elongate plurality of droplets or the total width of the droplet(s) immediately adjacent the separation).

The separation may have a length L (e.g., shortest distance between the first and second body edges) equal to or less than about 2 μm, more preferably about 200 nm to about 500 nm. Preferably, the ratio of a width W of the elongate plurality of printed droplets to a length of the separation may be greater than or equal to about 100. This may be achieved, e.g., by separation length L~200 um and second body edge length W~2 um. Alternatively, this may be achieved, e.g., by separation length L~300 nm and second body edge length W~30 μm. The maximum ratio may be, for example, 200 or 300.

In this regard, it may be advantageous to reduce the separation length L and the length (W, i.e., width W of the elongate plurality of printed droplets as above, e.g., the diameter of a printed droplet) of the second body edge substantially proportionally, particularly in comparison to a device achieving a desired separation (channel) conductance by means of greater electrode/channel width (e.g. a FET having parallel source and drain electrodes that determine the FET channel width in the direction transverse to current flow in the channel). Specifically, and as applicable to the separation as a FET channel and the first and second bodies as the source and drain electrodes of the FET, the length L is preferably reduced proportional to the printed electrode width so that the W/L ratio is unchanged by the reduction in printed electrode width relative to a FET channel width. In this manner, a desired conductance of the separation (channel) may be maintained, since the conductance may be substantially proportional to the ratio W/L.

The printed nature of the elongate plurality of droplets adjacent the first body may result in features that may be uniquely characteristic of the method embodiment of the present invention having been used. For example, and as shown in FIG. 1, the second body may comprise an edge portion immediately adjoining or continuous with said second body edge, said edge portion having a curvature B and said second body edge having length S, wherein B is less than about 2/S. (The curvature B may be definable by a standard definition such as 1/R, where R is the radius of curvature). Additionally or alternatively, the second body may comprise an edge portion having curvature B adjoining said second body edge and a tangent to said edge portion makes an angle of about α with second body edge, wherein said angle α and curvature B satisfy:

$$\alpha = \text{Arcsin}\left(\frac{S}{2} \cdot B\right) \pm 20°.$$

Any combination of one or more of the above optional features and advantages of the patterned substrate may be provided in an electronic device, e.g. a FET, comprising the above-described patterned substrate, particularly where a plurality of such electronic devices is provided in an array.

Such combination of one or more of the optional features and advantages may further be found in a FET, for example where the first and second bodies correspond respectively to the first and other electrodes of the FET.

Further regarding the FET, the elongate plurality of droplets may be substantially perpendicular to said edge of said first electrode. Furthermore, a width of said elongate plurality of printed droplets may be substantially equal to the width, e.g., diameter, of a printed single said droplet. The FET is particularly advantageous where a transistor array is desired. As for all transistor arrays and device arrays referred to in the present specification, the array preferably comprises a plurality of FETs of an embodiment of the invention as the arrayed transistors or devices, the transistors or devices preferably being provided on a single substrate, e.g., a plastic substrate or silicon chip or wafer, and preferably being fabricated in the same sequence of processing steps.

In the method of patterning a substrate for an electronic device, the liquid of the deposited (e.g., printed) elongate plurality of droplet is preferably conductive ink, e.g., metal (e.g. gold, silver, copper) based ink. This may be a metal nanoparticles based ink or a metal-complex based ink, e.g., silver-complex ink, e.g., TEC-IJ-010 that may be suitable for organic layers. (Such ink may further be used to print the first and/or second body of the above-described patterned substrate and any said electrode of a device incorporating the patterned substrate). Preferably, the deposited plurality of droplets is deposited partially or fully on the substrate. Thus, the deposited droplets may overlap the first body or be deposited in close proximity to but not in contact with the first body. In the latter case, the nearest droplet to the first body may spread on the substrate to extend nearer the first body, the repulsion however preferably preventing contact between the droplet and first body to form the narrow separation.

Similarly as for the above embodiments, the elongate plurality of droplets may be substantially perpendicular to the first body edge. Furthermore, the deposition of the elongate plurality of droplets may comprise depositing said droplets such that a width of said elongate plurality of droplets is substantially equal to a width, e.g., diameter, of a printed single said droplet, again similarly as for the above aspects. Further, any combination of one or more of the optional features and advantages of the patterned substrate described above may be provided in a patterned substrate formed by the method of the invention, e.g. for example where the first and second bodies of the patterned substrate correspond to the first and second bodies of the method.

More specifically regarding the method of the present invention, the liquid may comprise a solvent, so that the method may then further comprise evaporating solvent from the deposited elongate plurality of droplets. Advantageously, the boiling point of said solvent is such that evaporation takes place at room temperature, e.g., about 25 deg C., during a period of at least about 5 minutes to at least about 7 minutes, preferably at least about 1 minute.

The first body may be formed by a plurality of droplets of a liquid. Thus, both the elongate plurality and the first body may be printed, preferably in the same fabrication stage. Regardless of how the first body is fabricated, however, the method may further comprise depositing on the first body a layer for repulsion of said liquid of said elongate plurality of droplets, prior to said depositing said elongate plurality of droplets. Such a layer may be a self-assembled monolayer, e.g., 1H,1H,2H,2H-perfluoro-1-decanethio (PFDT).

Any combination of one or more of the above optional features and advantages of the method of the invention may be provided in an electronic device, e.g., wherein the first and second bodies of the method are the source and drain electrodes of a FET fabricated by the method and particularly wherein a plurality of such devices is provided in a device array.

Any of the above aspects may be applicable to organic, plastic or polymer electronic devices and arrays, e.g., polymer thin film transistors (TFTs) and arrays thereof. For example, the above aspects may be used to provide a patterned substrate or any above device or array formed on an inflexible or flexible substrate. The electronic devices may comprise conductive polymers, plastics or small molecules. In this case, the first and second bodies of the method may be at least some of the electrodes composing the device. Such bodies may be metallic, e.g., deposited in the form of a metal-based ink described herein, to improve conductivity.

BRIEF DESCRIPTION OF THE DRAWINGS

For a better understanding of the invention and to show how the same may be carried into effect, reference will now be made, by way of example, to the accompanying drawings, in which:

FIGS. 1(a) and (b) show SEM images of "T-shape" self-aligned printing (SAP; see detailed description) gold electrodes, where the second contact is printed at an angle of 90 degrees with respect to the first one and the channel width is defined by a single droplet. The naturally rounded shape of the droplet conforms to the edge of the first electrode and is deformed into a straight line along the edge of the first contact as shown in FIG. 1 (a). In this region a sub-micrometer electrically insulating gap is created; this is magnified in FIG. 1 (b), where a clear gap of ≈200 nm (indicated as 226 nm in FIG. 1(b)) can be observed.

DETAILED DESCRIPTION OF PREFERRED EMBODIMENTS

Figure 1:
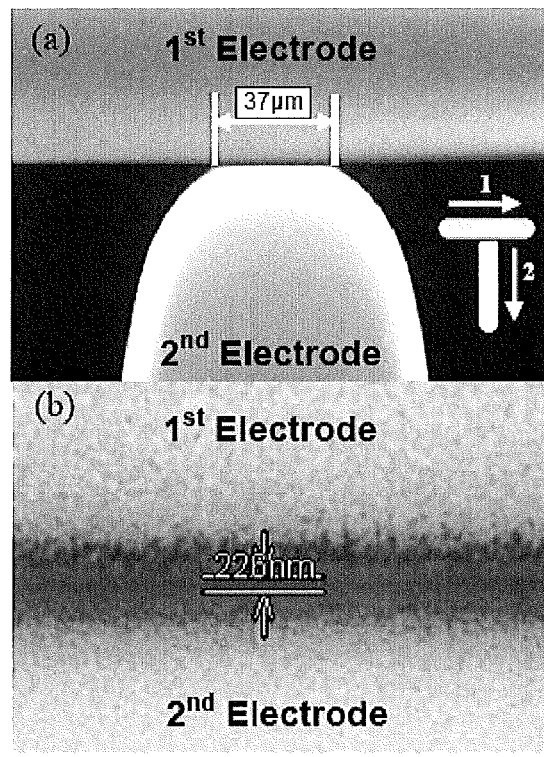
FIG. 1 (c) is a schematic diagram of the shape of the two electrodes in the vicinity of the single droplet contact, and includes the equation sin α=s/2r.
Figure 1:
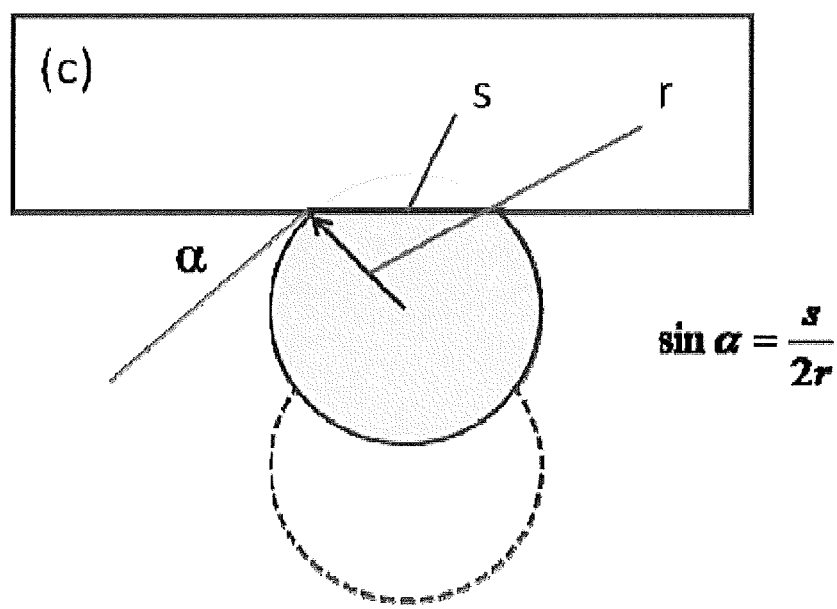

A self-aligned printing (SAP) technique may be capable of 100 nm resolution in a bottom-up process, advantageously without a requirement for pre-patterning and preserving the throughput of a drop-on-demand (DOD) printing system. Such a SAP technique may be based on printing a first conductive electrode line, modifying the surface of such first conductive electrode with a self-assembled monolayer (SAM) to become repulsive to the ink, and then printing a second conductive electrode line along the edge of the first electrode, such that the ink droplets flow off the previously printed conductive electrode and dry in close proximity, but not in electrical contact with the first printed electrode. Based on the SAP technique, fully downscaled organic transistors with submicrometer channel lengths achieving transition frequencies of 1.6 MHz may be obtainable.

However, the use of the above high resolution printing techniques for applications in nanoelectronics on the 100 nm length scale may depend on what patterning yield and uniformity is achievable. Regarding yield in particular, it may at least be difficult to use solution-based printing techniques to define large arrays of electrode gap structures on the 100 nm scale without electrical shorts. This may be the case particularly where parallel source and drain electrodes are printed for a FET device.

The present invention provides a device architecture for a printed nanochannel which may be based on single droplet contacts. The nanochannel may be formed as a separation between electrodes, one of which is a first body and another of which comprises an elongate plurality of printed droplets that is at least a portion of a second body. The droplets may be of a liquid such as an ink. The nanochannel may be formed by the above self-aligned printing (SAP) technique. (Note however that the first electrode may be formed by a deposition method other than printing, e.g., evaporation). As described above the device may be laid out in a characteristic T-shape, wherein the width of at least one of the arms of the "T" is determined by the diameter of a single printed inkjet droplet.

More specifically, the embodiment using the SAP technique may provide an electrode structure, which is prepared by depositing a second material (of a second body/electrode) partly overlapping (or adjacent to but not in contact with) a previously deposited first material (of a first body/electrode). A narrow gap or separation (nanochannel) between two electrodes is obtained by dewetting of the second material on the first material. The second material, in particular, may be deposited by printing successive ink droplets. Furthermore, the embodiment may provide that the two electrodes are non-parallel, preferably substantially perpendicular, and that at least one of the electrodes may have the width of a single droplet. Further still, the electrodes may be the source and drain electrodes of a FET and may for example be two PEDOT lines (e.g., PEDOT:PSS).

SAP techniques are described in the above international patent application WO03/056641 and in the paper Sele, C. W.; von Werne, T.; Friend, R. H.; Sirringhaus, H. Adv. Mater. 2005, 17 (8), 997-1001. Such techniques may be used in embodiments of the present invention.

The nanochannel may be self-aligned, with respect to formation of the narrow channel by repulsion ('self-aligned' in 'SAP' refers merely to the formation of a narrow gap between the electrodes by the repulsion, the opposing edges of the electrodes thus being self-aligned) and/or laterally such that one electrode printed at an angle of 5-90 degrees (i.e., non-parallel, preferably perpendicular) to the other electrode may be positioned at any point along the other electrode (See FIG. 1(c) where the elongate plurality of droplets (in this case two droplets) is positioned at the centre of a side of the other electrode (first body) but may provide as good a separation if located further towards either end of the first body). The lateral self-alignment due to the preferably perpendicular angle may allow alignment tolerance in fabrication of the different electrodes, in particular where these are made in respective fabrication process stages. Thus, the single-droplet device configuration and non-parallel layout of such an embodiment applying the SAP fabrication method may advantageously allow lateral self-alignment and/or channel edge self-alignment by repulsion, advantageously providing very low leakage currents, and thus further advantageously achieving high device yield. For example, the embodiment formed using SAP may allow high yields for patterning metal electrode arrays with gaps of 200-500 nm.

The embodiment may thus provide an improved direct-write, solution-based printing technique for electrode fabrication, which may be particularly advantageous for fabrication of an array comprising a large number of FETs. In contrast, and even where a higher resolution inkjet printing technique may allow fabrication of metal electrodes with gaps on the 100 nm scale, it may nevertheless otherwise be difficult to achieve scalability, yield and uniformity that are advantageous for some applications in nano- and molecular-electronics. The present invention may allow at least one of these disadvantages to be overcome.

In this regard, for manufacturing of low-cost and large-area electronic circuits, direct-write, solution-based, additive printing techniques as applied in the embodiment may generally be versatile and may offer significant process simplification. Additive printing may offer advantages in terms of process simplification, layer-to-layer alignment, compatibility with large-area processing, and/or potential cost reduction compared to subtractive lithographic patterning. Such printing techniques may even be capable of sufficiently high resolution for definition of electrode gaps on the 100 nm scale.

(In comparison, for graphic arts printing techniques such as inkjet printing, resolution as well as patterning yield may be limited by the relative large ink volume deposited in each droplet onto the substrate (1 pl corresponds to a droplet diameter of 12 µm) and the poor control of ink spreading on the substrate. In this regard, the issue of droplet volume may be improved by techniques such as by developing special electrohydrodynamic-jet printers capable of delivering sub-femtoliter ink volumes. This may allow definition of channel lengths down to 1 µm, disadvantageously coming, however, at the cost of reduced throughput).

As indicated above, the embodiment may provide self-aligned FET source and drain electrodes with, advantageously, low probability of an electrical short. Such an embodiment may further advantageously be used to provide a printed array of self-aligned transistors with high yield, for example in comparison to an array of transistors with parallel source and drain electrodes with a relatively wide channel (width in this particular context being transverse to the direction of current flow through the channel), even if this latter array is made with SAP. In this regard, it is noted that FET channel width may advantageously be significantly reduced without degrading performance. In particular, maintaining a proportional relationship between channel current and the ratio of channel width:length (the length being that between the electrodes) may allow the channel width to be reduced to a single-droplet width electrode as may be provided in the embodiment.

The provision of the non-parallel, preferably perpendicular, electrode comprising a continuous line of droplets having the width of a single droplet may allow a significant increase in yield. This may be because dewetting of the single droplet at the gap end of the electrode is unaffected by a neighbouring partially or fully dry droplet of the same electrode (the droplets may be printed sequentially). Thus, the increase may occur due to reduced influence of a neighbouring droplet, additionally or alternatively to reduced influence of pinning by substrate surface roughness. In an embodiment wherein the line of droplets has a width of two or more droplets printed successively parallel to the other electrode, one droplet may be drying as the neighbouring droplet is deposited, so that the flowing of the ink of each droplet may be affected by the drying of the preceding droplet. This may increase the likelihood of an electrical short where the width is relatively long, e.g., comparable to the width of a conventional FET channel. In contrast, the embodiment of the present invention having the single-droplet width electrode deposited non-parallel to the other electrode may allow high yield production even of devices having an electrode separation of the order to 200 nm, thus advantageously allowing a scalable fabrication technique for such devices. Furthermore, by maintaining an appropriate separation (channel) width:length ratio as described herein, good conductivity may be retained between the electrodes in spite of the narrow width of the single-droplet width electrode.

The embodiment may further allow electrode(s) themselves, even when of single-droplet width, to be fabricated with good conductivity. This may be achieved for example by the use of conductive ink. A conductive ink may be a highly conductive polymer ink (e.g. PEDOT:PSS) or preferably a printable metallic ink (e.g. gold, silver, copper). In particular, such electrode structures may be made with conductive inks that achieve bulk metal conductivities at low sintering temperatures, e.g., to be compatible with molecular electronic materials. Low temperature printable metal inks that allow such metal-like conductivities at low process temperatures (<150 deg C.) are advantageously compatible with plastic substrates and, particularly, with the limited temperature stability of molecular electronic materials. In this regard, the electrodes of the embodiment are advantageously made with metallic, e.g., silver-based, inks that offer conductivities close to those of bulk metals such as copper or silver in order to reduce parasitic voltage drops along long printed electrodes and interconnects. The embodiment may use an inkjet printable silver complex based ink with a sintering temperature as low as 130 deg C. In particular, a low-temperature precursor silver ink may be used that can be integrated (as described below) with underlying organic semiconductors and dielectrics to provide interconnects and electrodes with near bulk silver conductivities at 130 deg C. This can be used to realize a second level of printed metallization without degrading underlying organic semiconductors and dielectrics as required for many electronic applications.

Regarding detailed fabrication steps, in an embodiment, thoroughly cleaned Corning 1737F glass slides were used as substrates. For the definition of the electrodes with submicrometer gaps, Harima NPG-J gold nanopaste was used, suitably diluted with xylene and filtered with a 0.2 µm PTFE filter. After inkjet printing of the first electrode, its surface was modified by 1H,1H,2H,2H-perfluoro-1-decanethiol (PFDT, Fluorochem), therefore lowering its surface energy and allowing the definition of a channel length L≈200-400 nm upon self-aligned printing of the second electrode from the same gold nanopaste. The gold electrodes were then sintered on a hot plate at 250° C. for 1 h in air. To evaluate the electrical properties of the nanoelectrodes organic field-effect transistors were fabricated in a top-gate configuration using the self-aligned printed electrodes as source and drain contacts. Before the deposition of the semiconductor layer, the contacts were modified again with PFDT to improve charge injection. The semiconducting polymer poly(9,9-dioctylfluorene-cobithiophene) (F8T2, Sumitomo Chemicals) was dissolved in anhydrous xylene (5-7 gl$^{-1}$), spun at 2000 r.p.m. for 1 min in N$_2$ atmosphere and annealed at 80° C. for 20 min on a hot plate. A≈50 nm crosslinked poly(methyl methacrylate) (C-PMMA) dielectric layer was deposited on the top by spin-coating a 20 gl$^{-1}$ n-butyl acetate solution in ambient air at 4000 r.p.m. for 20 sec and annealed at 80° C. for 30 min. 1,6-bis(trichlorosilyl)hexane (Acro Organics) was added to the PMMA (Sigma-Aldrich, M$_w$=120.000) solution as a cross-linking agent. To realize printed electrodes and interconnects at upper levels of the device we used a silver complex base ink (TEC-IJ-010 InkTec Co., Ltd.), filtered with a 0.2 μm PTFE filter, which can achieve bulk silver like conductivities after relatively low-temperature sintering at 130° C. for 5 min on a hot plate in air. This allows realizing printed top-gate electrodes without degradation of any of the underlying organic layers. For the printing steps a custom inkjet printer was adopted, equipped with a single nozzle drop-on-demand (DOD) piezoelectric head (MicroFab Technologies, Inc.) with orifice diameter from 20 to 30 μm. The SEM images were taken with a Hitachi Tabletop Microscope TM-1000 in charge-up reduction mode. SAP yield measurements were performed on arrays of 72 devices with a PEGASUS S200 semi-automatic prober (Wentworth Laboratories, Inc.) connected to a B1500A (Agilent Technologies, Inc.) Semiconductor Parameter Analyzer (SPA). Transistors were characterized in a nitrogen atmosphere by means of an Agilent 4155B SPA.

FIG. 1 shows SEM images of the fabricated SAP gold contacts. The first contact is printed on the glass substrate, sintered and then its surface is modified with a self-assembled monolayer (SAM) of PFDT. The perfluorinated SAM actively deposited on the first contact may strongly reduce its surface energy, creating a sufficient surface energy contrast with the hydrophilic glass substrate to enable the SAP technique. The second contact is then printed at an angle of 90 deg with respect to the first one, realizing a characteristic "T-shape" (inset of FIG. 1 (a)). The length and shape of the two "arms" may advantageously be chosen to allow easier external electrical contacting and testing. However, the channel width is preferably defined by a single droplet only with diameter in the range of 30-80 μm. The first droplet of the second electrode pattern may be printed either partially on top of the first electrode or in close proximity to it: in the former case the low wettability of the surface of the first electrode leads to the complete dewetting of the droplet from the first pattern; in the latter case the ink droplet is printed sufficiently close to the edge of the first electrode that the contact line of the spreading droplet comes in contact but is repelled by the edge of the first electrode. In both cases the droplet dries in close proximity to the edge of the first electrode and the naturally rounded shape of the droplet conforms to the edge of the first electrode and is deformed into a straight line along the edge of the first contact. In this region a sub-micrometer electrically insulating gap is created. A typical channel is magnified in FIG. 1 (b), where a clear gap of ≈200 nm can be observed.

The T-shaped single droplet electrode configuration has been found to be advantageous for achieving high yields for forming electrically insulating electrode gaps without electrical shorts. A reason may be that in the T-shaped architecture the channel formation is determined by the fluid dynamics and dewetting of a single droplet only. Thus, the T-shaped architecture may allow easier optimization than for two parallel printed electrode lines wherein dewetting of each droplet is also affected by the state of previously and subsequently deposited droplets. The effect of subsequently deposited droplets may be, for example, to slow down the dewetting of a particular droplet because of it being pulled back by subsequent droplets that are being printed overlapping with the first electrode. For the T-shaped single-droplet structure, optimum ink and printing conditions were achieved when using a 1:3 vol. dilution of the Harima nanopaste in xylene and by printing at room temperature with a jetting frequency of 1 kHz, leading to contacts with width W=20-80 μm and channel length L≈200 nm. Leakage currents measured in ambient air are typically lower than 10 pA at a bias voltage as high as 40 V and breakdown voltages higher than 2 MVcm$^{-1}$ were measured. In terms of failure analysis, there may be an additional advantage that for a single droplet channels it is practical to observe the entire channel with SEM and correlate the occurrence of any electrical leakage current in defective devices with specific defects along the edge of the channel. This may be more challenging if the electrodes comprise two parallel printed lines with channel widths of a few hundred micrometers.

Figure 2:
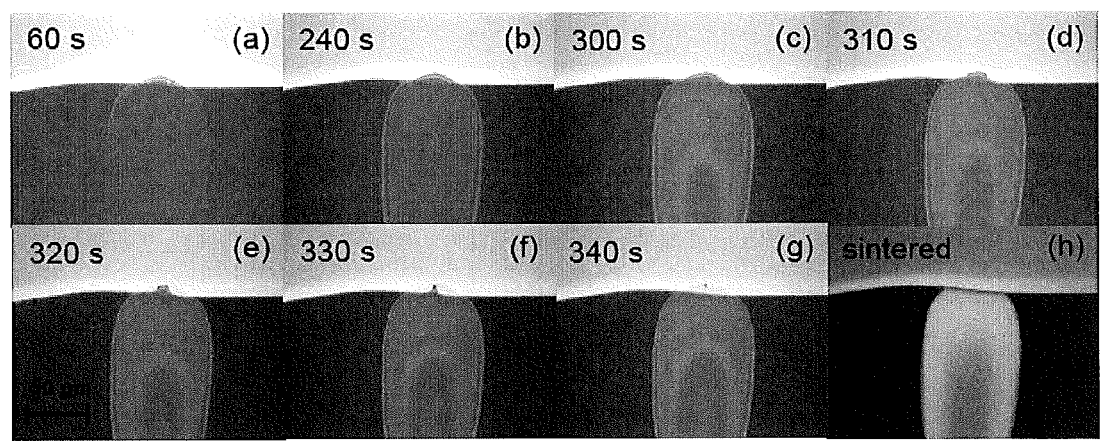
FIGS. 2 (a)-(h) show optical microscope images illustrating the complete dewetting of a line which shows overlap with the first pattern after t=60 s (a). For t≤240 s substantially no variations can be observed (b), while for t≥300 s, together with a variation of the ink color due to partial evaporation of the dispersing solvents, the contact line retracts and complete the dewetting process after 340 s (c-g). Upon sintering of the second line (h), the SAP electrodes are reliably formed.
Figure 6:
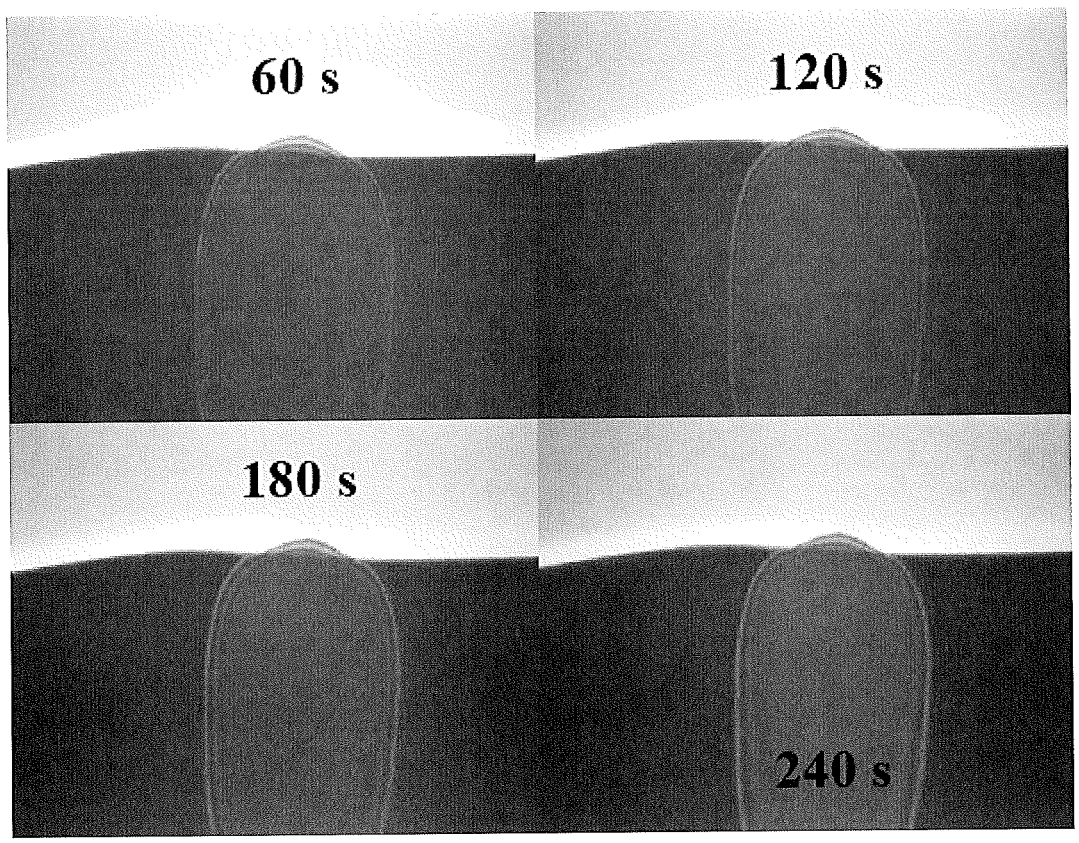
FIG. 6 shows optical microscope images showing the same contact of FIG. 2 for 60 s≤t≤240 s.

Under these conditions, it was found that a factor influencing fabrication of low leakage SAP contacts is the drying time of the ink. By using high boiling solvents for the ink formulation and allowing several minutes for slow drying at room temperature before the high temperature sintering step, the ink for the second contact may eventually dewet with very high yield. A series of optical microscopy images are reported in FIG. 2, where it is possible to follow the complete dewetting of the second line from the first one over a period of six minutes after printing. It was observed that after 60s the printed droplets still overlap significantly with the first electrode and complete dewetting has not occurred yet (FIG. 2(a)). No significant evolution can be observed over the next 3 min (FIG. 2(b) and FIG. 6). Subjecting the sample to the sintering temperature of 250° C. at this time may induce a fast drying of the ink and create short circuits. If the ink is left to dry at room temperature for longer time, complete dewetting from the first line may occur reliably on a characteristic time scale of 5-7 min for the ink formulation used here. It can be seen that after 310 s (FIG. 3(d)) the contact line starts to dewet from the surface of the first electrode in some regions, but remains pinned in others, presumably as a result of local defects on the surface of the first electrode. At 340 s (FIG. 3(g)) the contact line has completely depinned from these defects. Dewetting is now complete and sintering at this stage results in reliable formation of a nanochannel (FIG. 3(h)). Some color contrast was observed in the optical microscopy images on the first electrode from where the droplets have dewetted (FIG. 3(g)). This is either due to interactions of the ink solvent with the surface of the first electrode or due to some solvent/nanoparticle residues left after dewetting. However, this contrast disappears after sintering and does not appear to have any impact on the yield of nanochannel formation. The continuous drying of the ink can be followed through the observation of interference fringes and colours across the second printed line. This interference contrast changes markedly over the period of 6 minutes providing direct evidence that the driving force for the slow dewetting is the evaporation of solvent. This may exert an additional force on the contact line which may help to pull the pinned contact line back from the surface of the first electrode completely.

Figure 3:
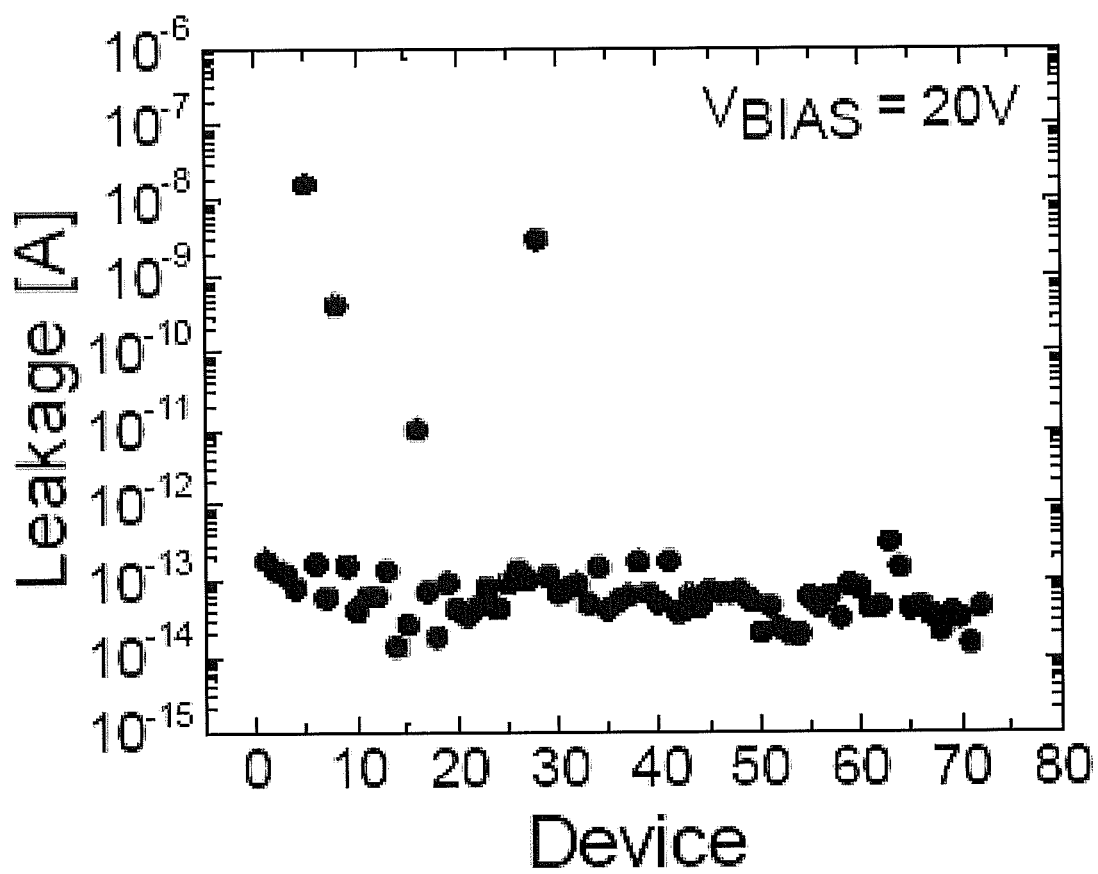
FIG. 3 shows yield measurement on a 6×12 array of single-droplet SAP gold electrodes. The leakage current in air, at an applied voltage of 20 V across the sub-micrometer gaps, is plotted for each device. Only 4 devices over 72 shows a leakage higher than 1 pA and no short-circuits are present.
Figure 7:
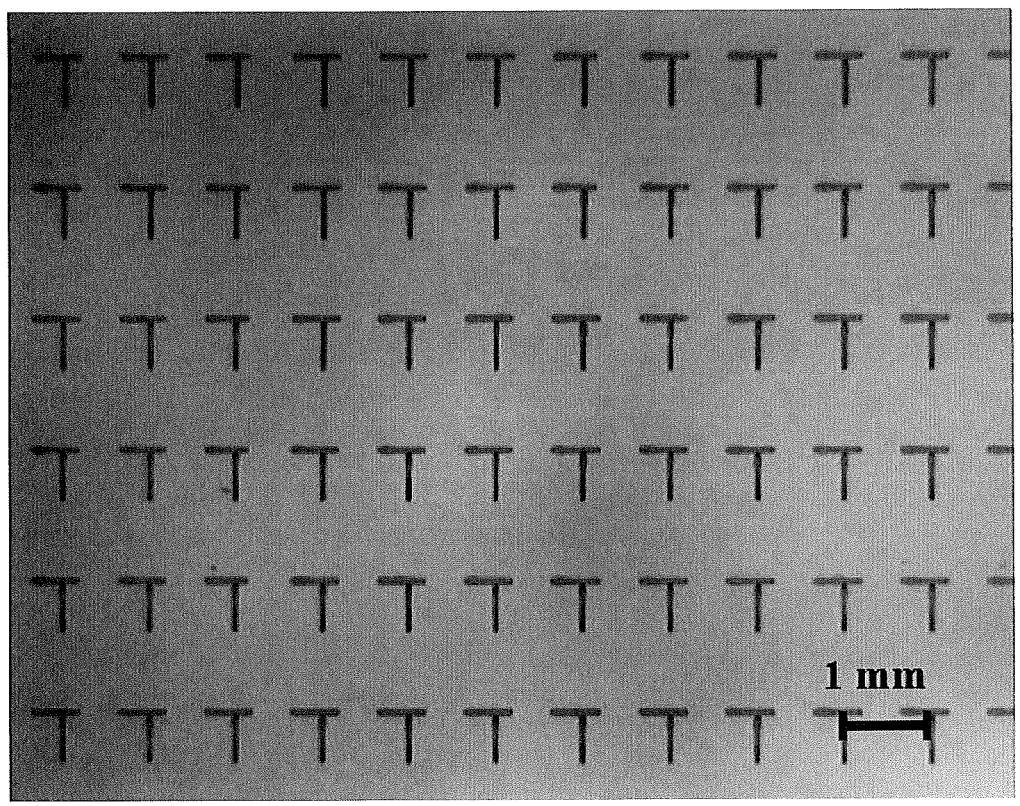
FIG. 7 shows an optical microscope image (transmission) showing part of one of the 6×12 arrays of SAP contacts fabricated, where 6 rows and 11 columns can be seen.
Figure 8:
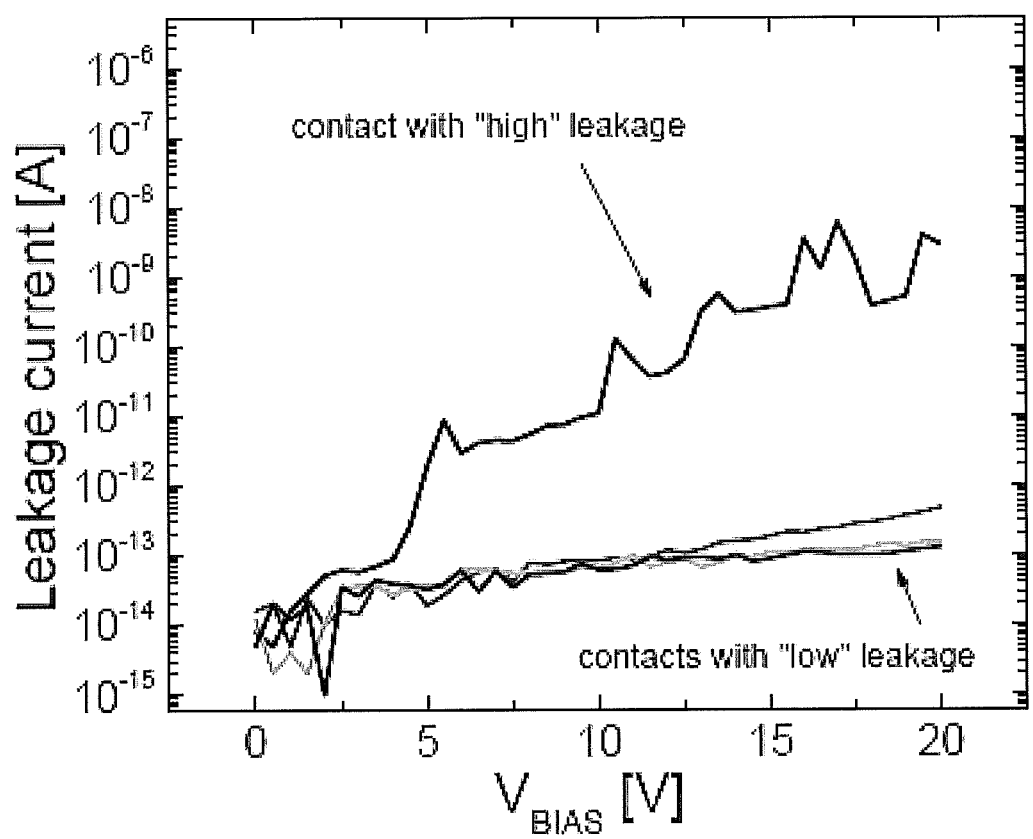
FIG. 8 shows typical I-V leakage curves of T-shaped SAP contacts.
Figure 9:
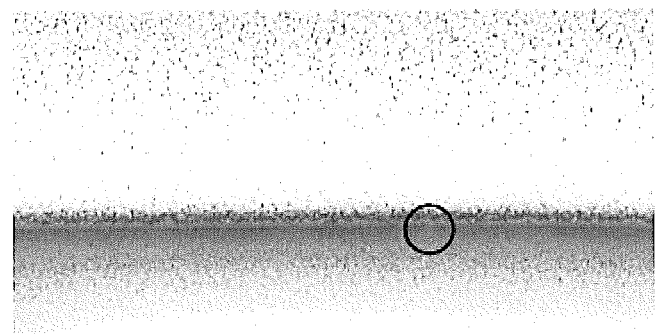
FIG. 9 shows SEM images of SAP channels presenting local defects, where some nanoparticles remain in the channel due to (a) pinning of the dewetting line inside the channel or to (b) local instability of the first line. In both cases the defects are likely due to imperfections/impurities on the substrate.
Figure 9:
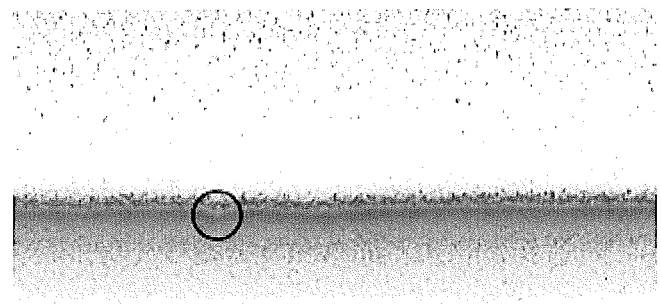
Figure 10:
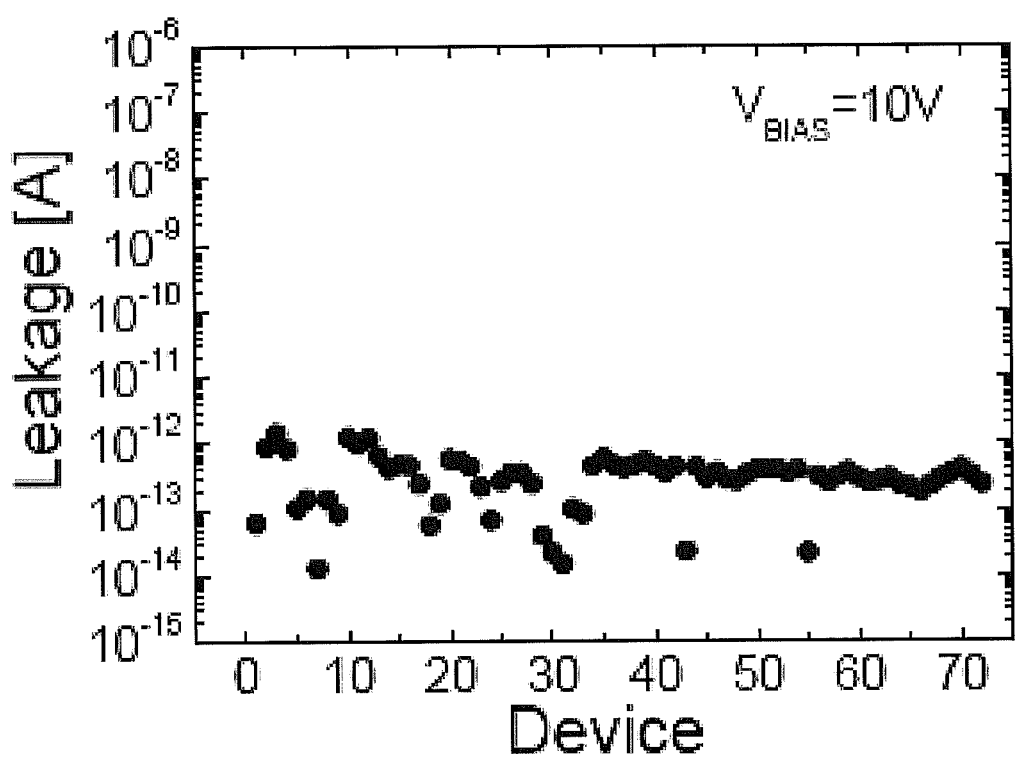
FIG. 10 shows yield measurement on a 6×12 array of single-droplet SAP gold electrodes. All 72 devices have a leakage current less than 2 pA at 10 V.

To investigate the yield of nanochannel formation using this approach, arrays comprising 6×12 contacts were fabricated and tested (FIG. 7). In FIG. 3, the leakage currents measured in air at an applied bias of 20 V are reported for a typical array. It can be seen that more than 94% of the contacts show a leakage current lower than 1 pA, close to the detection limit of our measurement setup. Only 4 contacts exhibit higher currents, but not a single device is short-circuited (typical I-V curves are reported in FIG. 8). The channels that exhibit higher leakage currents are typically associated with particle defects in the channel region (FIG. 9). By improving the cleanliness of the process these may be eliminated. In this regard, we have fabricated a number of arrays on which all 72 devices had a leakage current less than 2 pA at 10 V (FIG. 10). The process window for positioning the first droplet of the second electrode with respect to the first electrode pattern was found to be larger than 10 μm and this droplet placement accuracy is achievable with inkjet printing systems.

Figure 4:
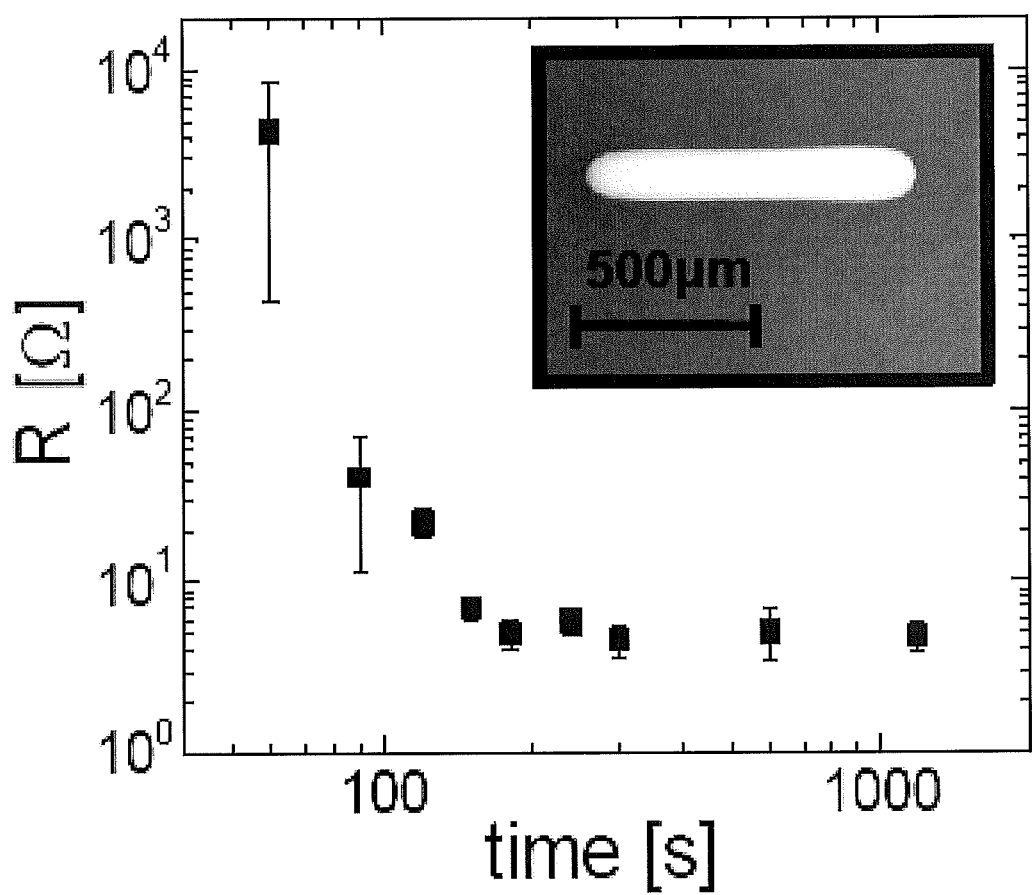
FIG. 4 shows resistance measurements of a ≈700 µm long Ag-complex based ink (TEC-IJ-010) line, printed on PMMA, upon sintering at 130° C. in ambient air. After 2-3 minutes a resistivity of only a few times $10^{-8}$ Ωm is reached. A typical line printed (length~700 µm; scale bar shown corresponds to length 500 µm) with a 30 µm nozzle at 1 kHz and sintered for 5 minutes is shown in the inset.
Figure 5A:
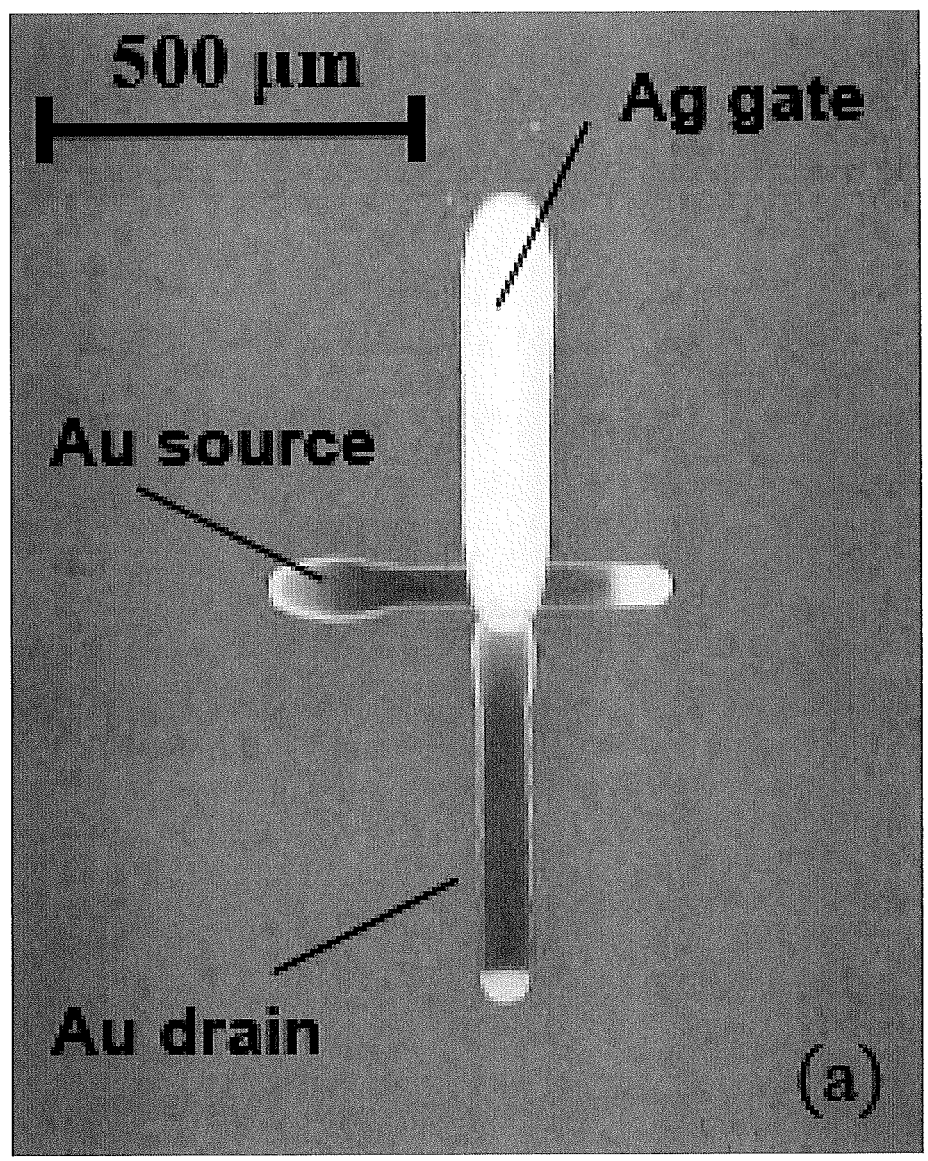
FIG. 5(a) shows an optical microscopy image of a complete and functional transistor, where the gold SAP source and drain contacts in the T-shaped configuration and the silver gate contact can be seen.
Figure 5B:
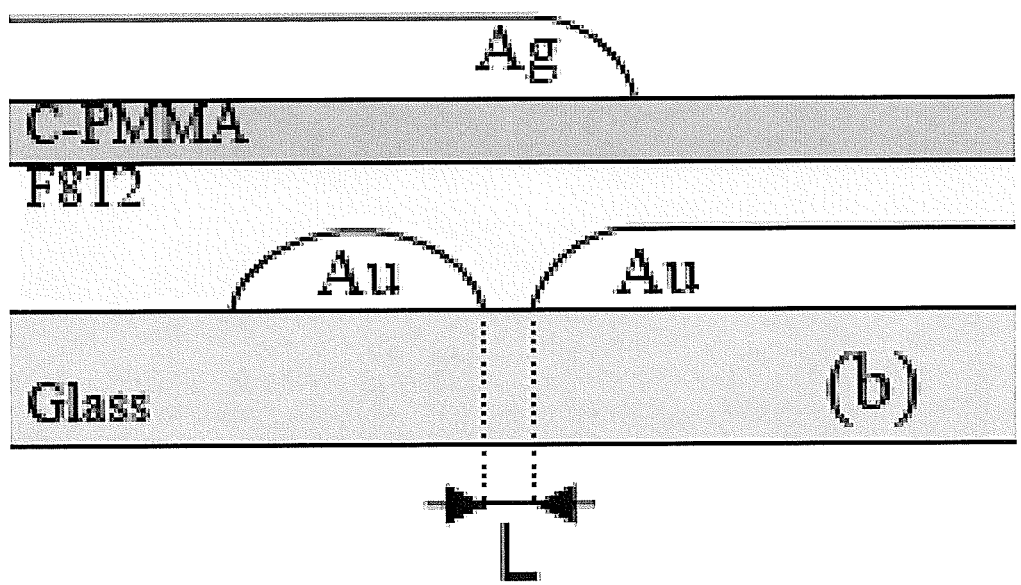
FIG. 5(b) shows a schematic cross-sectional diagram of the top-gate device architecture, wherein on top of the SAP gold electrodes a F8T2 polymer semiconductor and a C-PMMA gate dielectric layers are deposited by spin-coating. On top of the cross-linked dielectric, a silver gate line is printed and sintered.
Figure 5C:
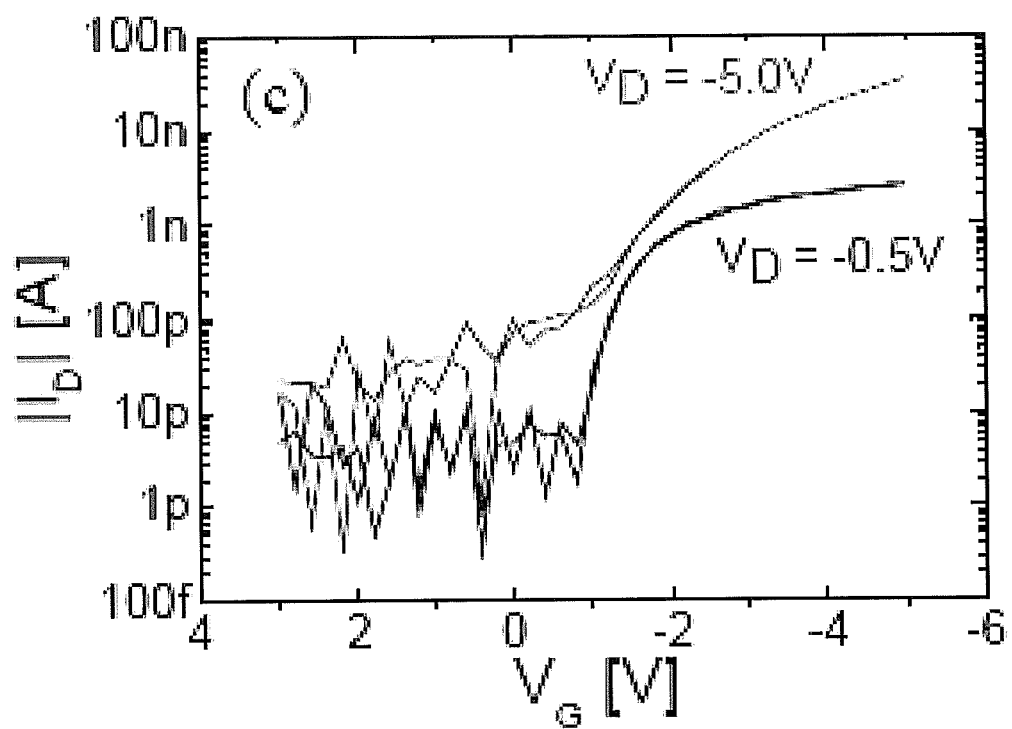
FIGS. 5(c) and 5(d) respectively show transfer (c) and output (d) characteristic curves of the device shown in FIG. 5(a) with L≈200 nm and a gate dielectric thickness of ≈50 nm. Clean saturation at voltages as low as a few volts and an ON/OFF ratio of $10^3$-$10^4$ are observed. The OFF current in the pA range is limited by gate leakage currents and not by the even lower leakage current between the SAP electrodes (100 fA) as measured in FIG. 3.
Figure 5D:
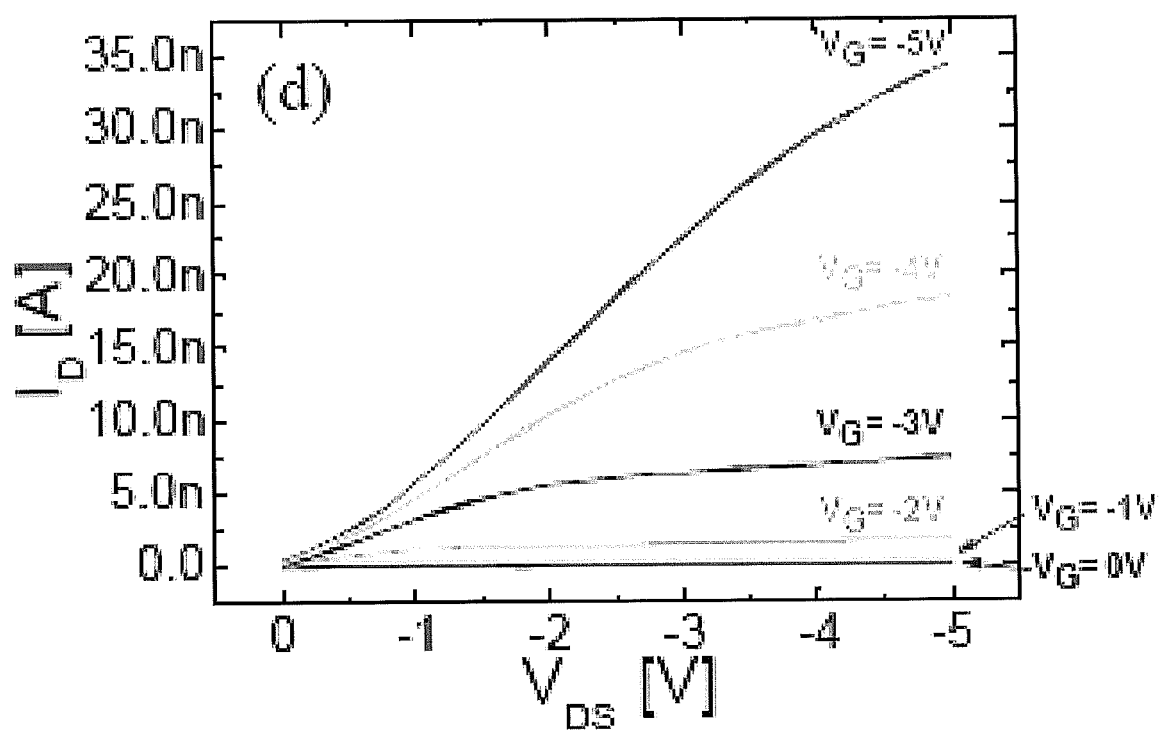

Some nanoparticle metal inks, such as those adopted for SAP contacts, may not be suitable for the definition of electrodes on top of organic layers because of the too high sintering temperature required to achieve adequate conductivity. For many applications, such as OFETs (organic FETs), it may be preferable to have at least two levels of printed metallization. Here the use of metal complex based inks is described with sintering temperature less than 150° C. These inks may be used in any embodiment (e.g., to form any combination of the source and/or drain electrodes, first and/or second bodies, elongate plurality of droplets referred above in relation to embodiments of the present invention). The commercially available silver complex ink TEC-IJ-010, which shows good adhesion to plastic substrates like PET and exhibits a viscosity and surface tension compatible with most commercially available printheads was used. Patterns comprising ≈700 μm long and ≈100-120 μm wide lines on top of a PMMA layer spun on glass were printed (inset of FIG. 4). These lines were subjected to post-deposition annealing at 130° C. for different lengths of time. It was found that after only 3 minutes the sintering process is complete and the lines show a resistance in the order of a few ohms (see FIG. 4), corresponding to an estimated resistivity in the range of $5-10 \times 10^{-8}$ Ωm, not far from silver bulk resistivity of $1.587 \times 10^{-8}$ Ωm. As a comparison, a similar line printed with a PEDOT:PSS based ink (H.C. Starck) would give a resistivity 7-8 orders of magnitude higher.

To demonstrate advantageous compatibility of these low temperature printed metals with organic materials, top-gate staggered all-printed transistors with SAP source-drain contacts were fabricated. In FIG. 5(*a*), an optical microscopy image of a complete and functional device is shown, together with a schematic cross-sectional diagram of the device architecture (FIG. 5(*b*)). The top-gate, staggered device architecture was chosen in order to take advantage of lower contact resistance effects. In FIG. 5(*a*), the gold SAP source and drain contacts can be seen in the T-shaped single droplet configuration. On top of this, a F8T2 polymer semiconductor and a crosslinked PMMA gate dielectric layers are deposited by spin-coating. On top of the dielectric, a silver gate line is printed and sintered, completing the device. The device has a compact design and a minimum footprint suitable for high density circuit integration which is limited only by the printed electrode linewidths. In FIG. 5(*d*), the output characteristics of an all-printed F8T2 FET with L≈200 nm are reported. Clean saturation at voltages as low as a few volts is observed, reflecting the correct scaling of the gate dielectric thickness (≈50 nm). The transfer curves in FIG. 5(*c*) exhibit an ON/OFF ratio of $10^3$-$10^4$. The OFF current in the pA range is limited by gate leakage currents and not by the even lower leakage current between the SAP electrodes (100 fA) as measured in FIG. 3. The device has a field-effect mobility of $2 \times 10^{-3}$ cm$^2$ V$^{-1}$s$^{-1}$. This demonstrates advantageous compatibility of the silver complex ink and its sintering process with underlying organic semiconductor and dielectric layers.

A specific embodiment provides a printed electronic device comprising a first metal electrode and a second metal electrode that approach each other to within less than 2 micrometers along an essentially linear shaped contact line with total length s, wherein the portion of the edge of the second electrode that is immediately adjoining said linear shaped contact line has a curvature b, which is less than 2/s.

A further specific embodiment provides printed electronic device comprising a first metal electrode and a second metal electrode that approach each other to within less than 2 micrometers along an essentially linear shaped contact line with total length s, wherein the portion of the edge of the second electrode that is immediately adjoining said linear shaped contact line makes an angle α with the linear shaped contact line and has a curvature b, wherein the following relationship is satisfied:

$$\alpha = \text{Arc } \sin\left(\frac{s}{2} \cdot b\right) \pm 20°.$$

Further in this embodiment, the first and second metal electrode may be arranged in a T or L-shape in the vicinity of the contact line.

A further specific embodiment provides a printed electronic device comprising a first metal electrode and a second metal electrode that approach each other to within less than 2 micrometers along an essentially linear shaped contact line with total length s less than 200 micrometers.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A patterned substrate for an electronic device, comprising:
    a source electrode in a form of a first elongate body having a pair of long edges and a pair of short edges, wherein at least one edge of the pair of long edges is a straight long edge;
    a drain electrode in a form of a second elongate body comprising a plurality of printed droplets, the second elongate body having a pair of long edges and a pair of short edges and an axis along a straight line between centers of two adjoining droplets, wherein a first short edge of the pair of short edges of the second elongate body is in close proximity to and parallel to said straight long edge of said first elongate body; and
    a submicrometer separation formed by repulsion between said straight long edge of said first elongate body and said first short edge of said second elongate body,
    wherein said axis of said plurality of printed droplets is at an angle of 90 degrees to said straight long edge of said first elongate body and said first elongate body and said second elongate body together form a T shape.

2. The patterned substrate of claim 1, wherein said plurality of printed droplets is perpendicular to said straight long edge of said first elongate body.

3. The patterned substrate of claim 1, wherein at least one of said first elongate body and said second elongate body comprises an electrode.

4. The patterned substrate of claim 1, wherein said submicrometer separation contains at least semiconductor.

5. The patterned substrate of claim 1, wherein said submicrometer separation contains at least dielectric.

6. The patterned substrate of claim 1, wherein a width of said first short edge of said second elongate body is less than 200 µm.

7. The patterned substrate of claim 1, wherein a width of said plurality of printed droplets is equal to or less than 250 µm.

8. The patterned substrate of claim 1, wherein a width of said plurality of printed droplets is equal to a diameter of a printed single said droplet.

9. The patterned substrate of claim 1, wherein said submicrometer separation has a length equal to or less than 2 µm.

10. The patterned substrate of claim 1, wherein a ratio of a width of said plurality of printed droplets to a length of said submicrometer separation is greater than or equal to 100.

11. The patterned substrate of claim 1, wherein said second elongate body comprises an edge portion adjoining said first short edge of said second elongate body, said edge portion having a curvature B and said first short edge of said second elongate body edge having length S, wherein B is less than 2/S.

12. The patterned substrate of claim 1, wherein said second elongate body comprises an edge portion having curvature B adjoining said first short edge of said second elongate body having length S and a tangent to said edge portion makes an angle of α with said first short edge of said second elongate body, wherein said angle α and curvature B satisfy:

$$\alpha = \text{ArcSin}\left(\frac{S}{2} \cdot B\right) \pm 20°.$$

13. The patterned substrate of claim 1, wherein said first elongate body and said plurality of printed droplets are arranged in a T-shape or an L-shape.

14. An electronic device comprising a patterned substrate of claim 1.

15. The electronic device of claim 14, wherein said electronic device comprises a field effect transistor.

16. A device array comprising a plurality of electronic devices according to claim 14.

* * * * *